(12) United States Patent
Van Veen et al.

(10) Patent No.: US 9,943,930 B2
(45) Date of Patent: *Apr. 17, 2018

(54) COMPOSITION OF A SOLDER, AND METHOD OF MANUFACTURING A SOLDER CONNECTION

(71) Applicants: Koninklijke Philips N.V., Eindhoven (NL); Mat-Tech B.V., Son (NL)

(72) Inventors: Nicolaas Johannes Antonius Van Veen, Eindhoven (NL); Mohammad Hossain Biglari, The Hague (NL)

(73) Assignees: Koninklijke Philips N.V., Eindhoven (NL); Mat-Tech B.V., Delft (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/749,703

(22) Filed: Jun. 25, 2015

(65) Prior Publication Data

US 2015/0290746 A1    Oct. 15, 2015

Related U.S. Application Data

(62) Division of application No. 13/626,943, filed on Sep. 26, 2012, now Pat. No. 9,095,933, which is a division
(Continued)

(30) Foreign Application Priority Data

May 27, 2004    (EP) ..................... 04102355

(51) Int. Cl.
   *B23K 1/20*      (2006.01)
   *B23K 35/26*     (2006.01)
   (Continued)

(52) U.S. Cl.
   CPC ........ *B23K 35/262* (2013.01); *B23K 35/0222* (2013.01); *B23K 35/24* (2013.01);
   (Continued)

(58) Field of Classification Search
   CPC ........ B23K 35/22; B23K 35/24; B23K 35/26; B23K 35/28; B23K 35/34
   (Continued)

(56) References Cited

U.S. PATENT DOCUMENTS 4,492,730 A    1/1985   Oishi
5,053,195 A    10/1991  McKay
(Continued)

FOREIGN PATENT DOCUMENTS

DE           10204960 A1      8/2003
KR       1019860700074 A      1/1986
(Continued)

OTHER PUBLICATIONS

Mu-Seob Shin et al: "Intermetallic formation in the Sn—Ag solder joints between Au stud bumps and Cu pads and its effect on the chip shear strength" Advances in Electronic Materials and Packaging 2001 (CAT.N0.01EX506) IEEE, Piscataway, NJ, USA, 2000, pp. 155-162, XP002307276.
(Continued)

*Primary Examiner* — Khanh Tuan Nguyen

(57)    ABSTRACT

The solder composition comprises particles of a thermodynamically metastable alloy. One of the elements of the alloy will form an intermetallic compound with a metal surface. The solder composition is particularly suitable for use in bumping of semiconductor devices.

7 Claims, 6 Drawing Sheets

Related U.S. Application Data of application No. 11/569,609, filed as application No. PCT/IB2005/051547 on May 11, 2005, now Pat. No. 8,298,680.

(51) Int. Cl.

| | | |
|---|---|---|
| *B23K 35/24* | (2006.01) | |
| *B23K 35/28* | (2006.01) | |
| *B23K 35/02* | (2006.01) | |
| *H05K 3/34* | (2006.01) | |
| *H01L 23/00* | (2006.01) | |
| *H05K 1/14* | (2006.01) | |

(52) U.S. Cl.
CPC ............ *B23K 35/26* (2013.01); *B23K 35/264* (2013.01); *B23K 35/28* (2013.01); *B23K 35/286* (2013.01); *H01L 24/29* (2013.01); *H05K 1/14* (2013.01); *H05K 3/3484* (2013.01); *H01L 2224/2919* (2013.01); *H01L 2224/29109* (2013.01); *H01L 2224/29111* (2013.01); *H01L 2224/32245* (2013.01); *H01L 2224/48247* (2013.01); *H01L 2224/48464* (2013.01); *H01L 2224/73265* (2013.01); *H01L 2924/01029* (2013.01); *H01L 2924/0132* (2013.01); *H01L 2924/0133* (2013.01); *H01L 2924/01322* (2013.01); *H01L 2924/01327* (2013.01); *H01L 2924/13091* (2013.01); *H01L 2924/14* (2013.01); *H01L 2924/181* (2013.01); *H05K 2201/0215* (2013.01); *Y10T 428/1216* (2015.01); *Y10T 428/12028* (2015.01); *Y10T 428/24826* (2015.01); *Y10T 428/31678* (2015.04)

(58) Field of Classification Search
USPC .................................. 428/615, 686; 420/590
See application file for complete search history.

(56) References Cited

U.S. PATENT DOCUMENTS

| | | | |
|---|---|---|---|
| 5,198,189 A | 3/1993 | Booth | |
| 5,202,153 A | 4/1993 | Siuta | |
| 5,328,087 A | 7/1994 | Nelson | |
| 5,471,092 A | 11/1995 | Chan | |
| 6,291,016 B1 | 9/2001 | Donges | |
| 8,298,680 B2 * | 10/2012 | Van Veen | B23K 35/0222 252/500 |
| 2004/0025976 A1 | 2/2004 | Hebner | |

FOREIGN PATENT DOCUMENTS

| | | |
|---|---|---|
| WO | WO8504518 A1 | 10/1985 |
| WO | WO9619314 A1 | 6/1996 |
| WO | WO0189757 A1 | 11/2001 |
| WO | WO0220211 A1 | 3/2002 |
| WO | WO03072288 A1 | 9/2003 |

OTHER PUBLICATIONS

EPO as ISA, PCTIB2005/051547 filed May 11, 2005, "International Search Report and Written Opinion" dated Aug. 12, 2015, 11 pages.
First Office Action dated Aug. 15, 2008, China Patent Application No. 200580017108.0, 9 pages.
Office Action dated Mar. 25, 2011, Taiwan Patent Application No. 094116908, 8 pages.
Office Action dated Aug. 11, 2011, Taiwan Patent Application No. 094116908, 3 pages.
Office Action dated Sep. 5, 2011, European Patent Application No. 05736214.7, 3 pages.
Notification of Reason for Refusal dated Jan. 5, 2012, Korea Patent Application No. 10-2006-07024635, 10 pages.
Notice of Final Rejection dated May 7, 2012, Korea Patent Application No. 10-2006-07024635, 6 pages.
Notification of Reasons for Refusal dated Jul. 5, 2011, Japan Patent Application No. 2007-514227, 4 pages.
Decision of Refusal dated Jun. 29, 2012, Japan Patent Application No. 2007-514227, 6 pages.

* cited by examiner

COMPOSITION OF A SOLDER, AND METHOD OF MANUFACTURING A SOLDER CONNECTION

The invention relates to a composition of a solder.

The invention also relates to a method of manufacturing of an electrically conducting connection between a bonding area at a first substrate and a bonding area at a second substrate with a solder composition, comprising the steps of:
providing the solder composition onto the bonding area at the first substrate;
assembling the first and the second substrate, such that the solder composition is sandwiched between the said bonding areas at the first and the second substrate, and
providing the electrically conducting connection by heating of the solder composition.

The invention further relates to a substrate with a bonding area on which a layer of a solder composition is present and to an assembly of a first and a second substrate provided with bonding areas that are mutually connected with an electrically conducting solder connection.

Solder compositions are known per se for the connection of metallic surfaces. The metallic surfaces may extend over a large area, but are alternatively limited to small areas at an otherwise electrically insulating surface. The latter situation particularly occurs in the context of electronic components and products. An application of specific relevance is constituted by that of integrated circuits and the like. These integrated circuits are increasingly connected to carriers in a flip-chip orientation with a plurality of solder or metal bumps. Trends herein are the use of a larger number of bumps per integrated circuit and the reduction of the pitch between neighbouring bumps, and in particular the combination of both.

Requirements for the connection of electronic components to carriers are both that of mechanically stability and electrically conductivity. Solder compositions fulfill these requirements in an excellent way. This has a number of reasons: the solder is first of all, electrically conducting; better than alternatives as anistropically conducting glue and the like; then, the solder can be applied in ball-shaped portions—that are also referred to as bumps—; moreover, the solder bumps can be applied before assembly and will flow out only at elevated temperatures under a heat treatment. It is therein even possible to transport a substrate with bumps. Said elevated temperature is at the same time not so much elevated that the carrier or the components will breakdown or are damaged. And finally, the solder connection can absorb pressures as a consequence of differences in thermal expansion between the component and the carrier.

The presently available solder compositions however also have disadvantages. One of those disadvantages is the need for adhesion layers if the contact comprises a certain metal. Such metals are also classified as badly solderable contacts. The badly solderable character often consists therein that an oxide surface layer is formed at the contact. This oxide surface layer is electrically insulating and prohibits a direct connection between the solder and the metal. As a consequence, both adhesion problems and conduction problems will appear. In order to solve such badly solderable contact, the contact is generally provided with adhesion layers. Such adhesion layers need to be applied separately, which involves additional process steps and additional costs. Moreover, the adhesion layers restrict the use of such badly solderable metals, particularly in that component and carrier need to withstand certain minimum temperatures. The complexity of the problem is moreover increased in that the contact at a first substrate comprises a different metal that the contact at a second substrate that faces the first substrate.

It is therefor a first object of the invention to provide a solder composition that may be applied to establish an electrical connection between bonding areas at two opposed substrates, at least one of which contacts is badly solderable.

It is a second object of the invention to provide a method of manufacturing an electrically conducting connection of the kind mentioned in the opening paragraph, which connection may be established onto a badly solderable bonding area without a separate application of a adhesion layer.

The first object is achieved in that particles of a thermodynamically metastable alloy are dispersed in the solder composition, which alloy comprises an element that on application of the composition to a metal containing surface will form an intermetallic compound with the metal of said surface.

The second object is achieved in that a first of said bonding areas at the first and second substrate contains an alloying metal and that a solder composition is applied, in which particles of a thermodynamically metastable alloy are dispersed, which alloy comprises an element that will form an intermetallic compound with the alloying metal of the first contact.

The solder composition of the invention is in fact a chemically stable, two-phase mixture of compounds that allow the provision of a good electrical connection to contacts at opposed substrates. But although chemically stable per se, the particles in the composition are thermodynamically metastable. This means that if the composition is heated, the constituents of the particles have the tendency to take on a different physical chemical shape, e.g. to diffuse into the solder composition and possibly to react. The constitution of the metastable particles can therein be chosen such as to remove any oxide surface layer at the surface of a badly solderable contact. The oxide surface layer is then not only removed, but replaced by an electrically conducting adhesion layer of an intermetallic compound. This intermetallic compound comprises both an element of the contact and an element originating from the thermodynamically metastable particles. The adhesion layer provides then the adhesion between the contact and the solder composition. An important feature of the invention is moreover that any surplus of particles in the solder composition will after cooling down continue to exist as a second phase in the solder connection without substantial negative impact on the mechanical stability or the electrical conductivity of the solder connection.

It is a first advantage of the present invention that the solder composition adheres at a large variety of different surfaces. These include, metals like aluminium, copper, gold, nickel and alloys therewith; semiconductor materials such as an ohmic contact of doped silicon; conductive oxides and nitrides such as indium-tin-oxide, ruthenium oxide and titanium nitride. Particularly advantageous is the application hereof in circumstances that do not allow a standard solder bump in view of the oxidizing surface, and particularly aluminium, nickel (that otherwise is provided with a gold surface), silicon and indium-tin-oxide. Major applications hereof are respectively labels and other conventional ICs; immersion soldering for fine pitch processing, particularly with a solder composition with a Sn-matrix such as BiSn or PbSn; die attach; and chip-on-glass processes and display drivers in particular.

It is a second advantage of the present invention that the contacts at opposing substrates may contain a different metal as their primary component. In this case, the adhesion layer may be formed at the contact of a single substrate only. Suitable examples include aluminum and copper; aluminium and gold; indium-tin-oxide and copper or aluminum, etc.

It is a further advantage that the solder composition can be lead-free. The application of lead-free solder is required for environmental reasons.

The particles of a thermodynamically stable nature that are applicable comprise as alloying element for the intermetallic compound particularly and preferably one or more of the group of indium, tin, bismuth and zinc. These elements can form intermetallic compounds with aluminum in particular, but also with other elements such as tungsten, titanium, vanadium and nickel. In fact, the alloying element is herein chosen from one of the higher groups of the periodic table (V, VI, Vb), whereas the elements present in the contact are in the lower groups of the periodic table (III, Ma, Iva), so as to enable to establish a noble gas configuration which forming the alloy.

In a further embodiment, the particles further comprise an element that is able to form an oxide preferentially above aluminium oxide or tin oxide. This element is particularly chosen from the group of titanium, chrome, aluminum and nickel. An alternative approach is a treatment with a suitable acid solution for the removal of the aluminum oxid layer. It is observed that aluminium can act as this component, notwithstanding an aluminium oxide surface, since the aluminium oxide of the surface turns out to have another energy level than that of the oxide particles formed from the metastable element. The resulting situation is a dispersion of these oxide particles in the solder bump.

Suitable compositions of the metastable particles are for instance $SnAg_4Ti_4$, and $ZnAl_6Ag_6$. Although these particle compositions are known per se, the use of these compositions as particles in a standard solder composition to obtain solder droplets that can be applied for bumping of semiconductor devices is not known. Moreover, the present use is an application to semiconductor devices with its specific requirements. The Sn-based particles herein have melting temperatures of 200-238° C., the Zn-based particles have melting temperatures of 380-426° C. It has found that it is not necessary to heat the solder composition to a temperature above the melting temperature of the particles, but only to a temperature above the melting point of the matrix material.

In a particularly preferred embodiment the reacting element is Sn and the solder composition comprises Sn. The presence of tin in both the particles and the solution provides an improved stability of the composition. The use of tin-containing solder is furthermore well established in the field of semiconductor assembly. Suitable examples of such solders are the SAC (tin-silver-copper) solder, and tin-based solders such as SnCu, SnBi, PbSn, SnIn, SnZn and ternary or quaternary alloys of tin, indium, bismuth and zinc. The combination of such tin-containing solder with an metallization or bump of gold is most preferred, in that then an eutectic AuSn interconnect may be formed. The use of a tin-containing solder is furthermore advantageous in that it has a relatively low melting point. As a consequence, the solder composition of the invention can be applied for badly solderable contacts on carrriers that can withstand only a reasonably low temperature. Such carriers are particularly organic and flexible carriers.

Generally, the dispersed particles are present in a weight concentration of 0.1 to 90%, and preferably in a weight concentration of 0.5 to 60%. The concentration is preferably on the lower side hereof, in the order of up to 10%, as it is sufficient to form a thin layer of the intermetallic compound. The exact concentration may be chosen up to desire also in view of viscosity of the composition, and particle size. It will be understood that the rheology of the composition is an important factor in order to ascertain that the surface of the contact will be covered by the intermetallic compound as much as desired. It is of course highly preferred, both for the chemical stability and for the electrical conductivity, that the complete contact is covered with the intermetallic compound.

The average diameter of the dispersed particles is for instance in the range from 0.1 to 80 µm. Preferably the average diameter is in the range from 0.3 to 20 µm. The minimum size of the dispersed particles is only determined by the tendency to dissolve in the solder composition, as such a dissolution may change the phase of the elements in the particles, and therewith the reactivity. It will be understood that a small size is preferred in order to obtain a thin layer of the intermetallic compound with uniform thickness. Moreover, a small size enhances the uniformity of the distribution of the particles in the solder composition. Additionally, small particle sizes appear to be required for applications in which the pitch between individual dots of the solder is small. The pitch is generally defined as the distance from the center of one solder bump to the center of a neighbouring solder bump. Small herein implies a distance of 15 to 40 µm, and it will be understood that the particles need to be an order of magnitude smaller than that at least, and preferably even more than that.

The composition of the invention is specifically suitable for use as solder bumps in electronic applications, in which the bonding areas are limited to bond pads on an otherwise substantially electrically insulating substrate. Such bond pads generally have a dimension of less than 100*100 micrometers, including also less than 10*10 microns, however, they may be larger as well. Alternatively, the solder composition of the invention is used for other applications. A particular application is the die attachment of components to a carrier. Surprisingly good results have been obtained for the attachment of dies comprising a semiconductor substrate. Other applications include the connection of two larger plates, the provision of rings of solder. The particle size may be adapted in this context so as to act as a spacer that determines the distance between individual surfaces of two opposing substrates.

In the method of the invention, it is highly preferred that one of the bonding areas—in particular bond pads to which is also referred as contacts—comprises aluminum. This metal is not only used as interconnect material in integrated circuits and other components such as passive networks. It can be applied on labels and other flexible substrates at low temperature and has, through its natural oxide layer a good protection against humidity and the like. However, the use of aluminum has often provided problems and costs in that separate adhesion layers had to be applied, generally at higher temperatures. In the invention, this is not problematic.

It is moreover suitable, that the first contact is present at the first substrate and the contact at the second substrate comprises a thickened top layer, that will form an alloy with the solder composition. Although the reverse is not excluded, good results have been obtained in experiments in which the intermetallic compound will form at the substrate at which the solder composition is applied. This has the advantage that a stable connection and protection of the first contact can be formed directly after the provision of the solder composition. The connection to the second substrate can be carried out at a later stage, and possibly at another location. In view of the high stability of the intermetallic compound, this will not be redissolved in a later soldering step; however, the layer of the intermetallic compound may be thickened as a consequence of continued deposition.

The presence of a thickened top layer leads to the formation of an alloy with the solder composition. Examples of thickened top layers include under bump metallizations, stud bumps, galvanic bumps and the like. Suitable materials are known per se to the skilled person and include for instance nickel, copper and gold.

The method of the invention is particularly suitable for the provision of components, such as integrated circuits on flexible carriers. However, it is certainly not limited to this application. Other suitable applications comprise chip-on-chip applications, in which bond pads on one chip are connected to bond pads on another chip. Often, although not necessary, at least one of these bond pads comprises aluminum or an aluminum alloy. A first combination of chips is that of a memory chip and a processor or other logic chip. An alternative combination is an integrated circuit with a network of passive components as a carrier. A further combination is for instance an integrated circuit with on top of that a passive component or network. Particularly for this latter component the solder of the invention appears to be highly suitable, as this needs to be a small pitch solution. Also, since no separate adhesion layer is needed, the costs are lowered and the flexibility is increased. In a present version the metallisation layer of such a passive network is made of aluminum. The use of the composition of the invention allows the reduction of mask steps substantially. Furthermore, the composition of the invention might well be tuned so as to have limited wettability to aluminum or aluminum oxide only. In this manner, the solder composition can be applied maskless, and continued adhesion will be established through the formation of the intermetallic compound.

Any heating needed for the formation of the intermetallic compound can be provided locally or over the complete substrate. Use of a reflow oven is an option but is not needed.

As stated above, the solder composition may be applied on a substrate that is thereafter sold or transported to another location. The intermediate product is thus a substrate with the solder composition of the invention in the form of droplets or the like. The substrate will generally be part of the component, in casu the integrated circuit. The pattern of contacts may be a ball grid array as generally used. It is however certainly not excluded that use is made of a pattern of bond pads on active.

The solder may be applied to the surface of the component in the form of bumps, i.e. by individually depositing droplets. An alternative, but suitable method is the use of immersion solder bumping. Herein the particularly Sn-containing layer is provided on a suitable under bump metallisation, for instance of nickel or copper, by immersion. In this case, the opposite substrate may have the badly solderable contacts. The advantage of immersion soldering is the reduced pitch that can be achieved herein.

The invention further relates to an assembly of a first and a second substrate provided with contacts that are mutually connected with an electrically conducting solder connection.

It is a further object of the invention to provide such an assembly that has an adhesion layer that provides good contact.

This object is achieved in that an adhesion layer comprising an intermetallic compound is present at an interface of at least one of the contacts and the solder connection, said compound comprises an element present in the contact and an alloying element originating from the solder composition.

These and other aspects of the composition and the method of the invention will be further elucidated with reference to the figures, in which.

The Figures are not drawn to scale and the same reference numbers in different Figures refer to like parts.

Figure 1:
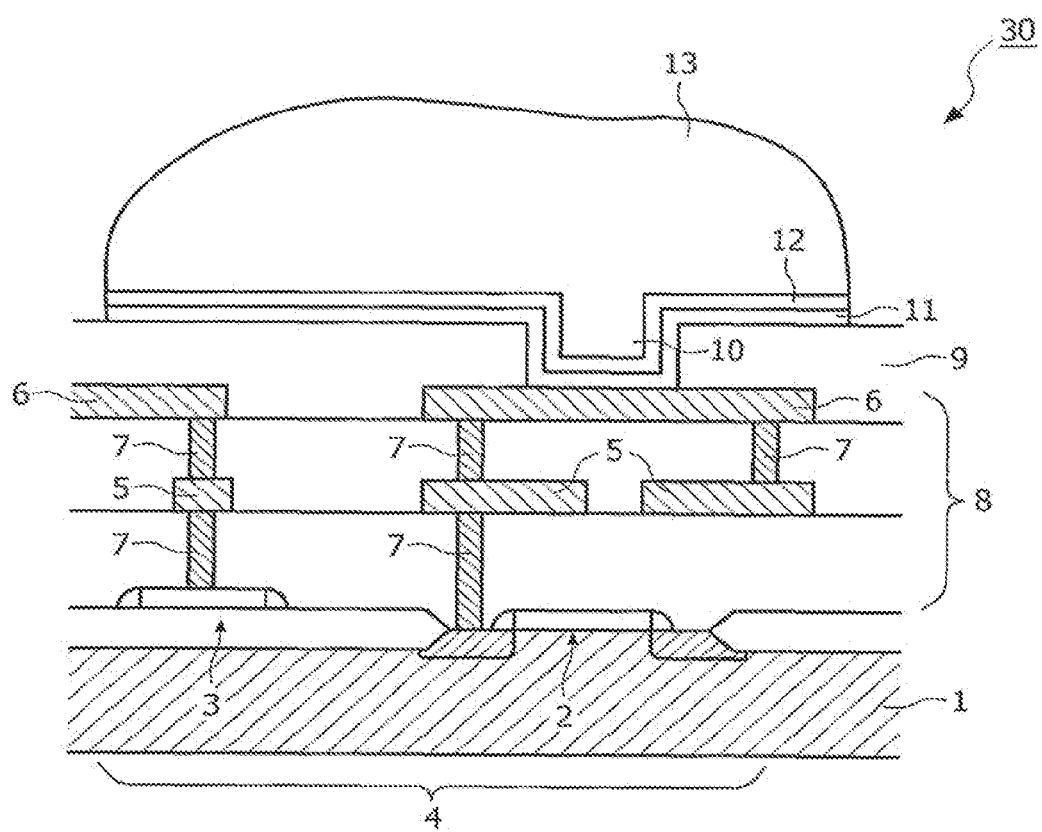
FIG. 1 shows a diagrammatic cross-sectional view of the prior art substrate.

FIG. 1 shows a diagrammatical cross-sectional view of a prior art substrate. This substrate is an integrated circuit device. It comprises a plurality of elements, in this case a MOS transistor 2 and a polysilicon track 3. The circuit has been provided in an active circuit area 4 at a surface of a semiconductor body 1. In overlying relationship relative to the circuit devices 2,3 an interconnect structure 8 is provided for interconnecting the circuit devices 2,3 to form the circuit. In this embodiment, the interconnect structure 8 comprises a first patterned metal layer 5, a second patterned metal layer 6 and interconnection vias 7. The patterned metal layers 5,6 comprise in this example Al or an aluminium alloy, such as AlCu. On top of the interconnect structure 8 a layer of a passivating material 9 has been disposed. The passivating material is for instance silicon nitride or silicon oxide. The passivation structure may comprise further layers that inhibit radiation and are chemically stable against reactive etchants, so as to provide a hurdle against unauthorized access to the integrated circuit. The latter is primarily important for application of the integrated circuit in smartcards and the like. By means of a photolithographical steep and etching a via contacthole 10 has been formed extending from the second patterned metal layer 6 and passing through the layer of passivating material 9. A barrier layer 11, for instance comprising TiW or Ti/Pt is provided on the layer of passivating material 9 and in the via contact hole 10 for instance by means of a sputtering process. The barrier layer 11 is relatively thin compared to the layer of passivating material 9 and has a thickness of about 200 to 300 nm. On top of the barrier layer 11 a metal layer 12 has been deposited for instance by means of a sputtering process. This metal layer 12 may for instance comprise Au and has a thickness of 100 to 200 nm. Subsequently a Pb/Sn bump 13 has been grown on the barrier layer 11 and the metal layer 12 by means of electroplating preceded by a photolithographical step to define the bump dimension. Together, the barrier layer 11, the metal layer 12 and the bump 13 form the bump electrode. The bump electrode lies substantially straight above the active circuit area 4.

Figure 2:
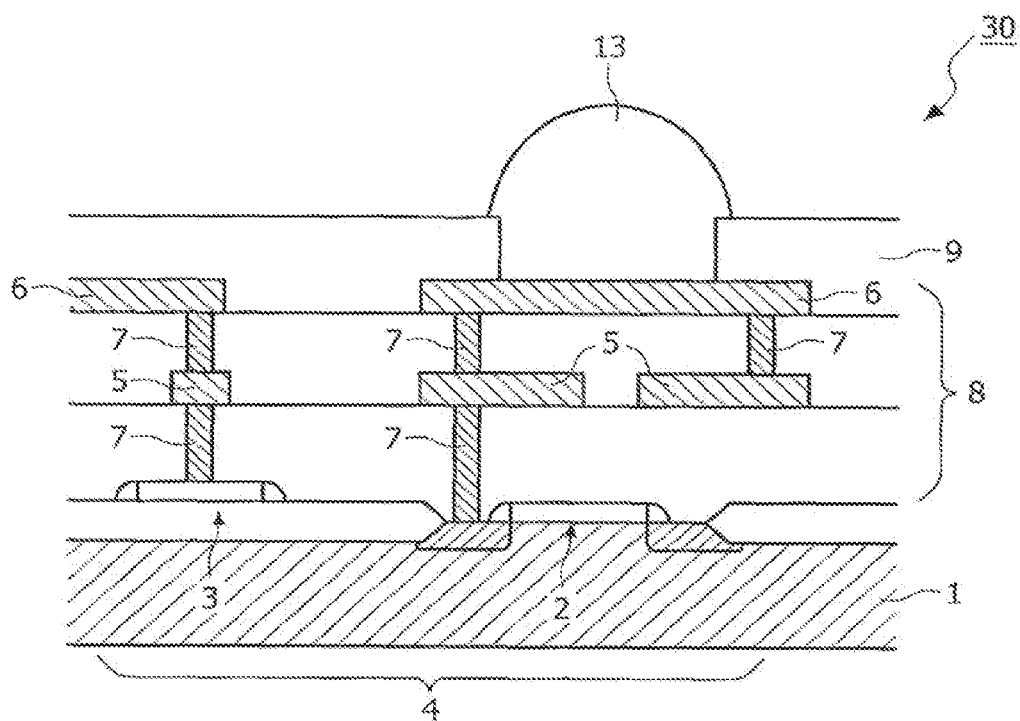
FIG. 2 shows a diagrammatic cross-sectional view of a substrate according to the invention.

FIG. 2 shows in diagrammatical cross-sectional view a substrate of the invention. In this substrate, the barrier layer 11 and the metal layer 12 are absent. Instead, use is made of the solder composition of the invention as the material for the bump 13. This material is printed as a solder paste, in which the passivation layer 9 acts as the solder resist material. Use is made of eutectic $Sn_{43}Bi_{57}$-soldering alloy as the matrix material, comprising 4.5% by weight of particles of $Sn_{92}Ag4Ti4$ and 0.5% by weight of particles of $Sn_{90}Al_6Ag_4$. The solder composition is applied in the contact holes 10 to the bond pads of Al or an Al alloy, which are defined in the second patterned metal layer 6. These bond pads are provided with a native aluminium oxide layer. The solder composition is made to attach to the bond pads by a heating step to above the melting point of the matrix material. The heating step was carried out at 170° C. in this example, as the melting point of eutectic tin-bismuth is 139° C. The resulting structure is applied to a carrier. The bond pads had a size of about 50×50 microns, which is however not critical and open to reduction.

Figure 3:
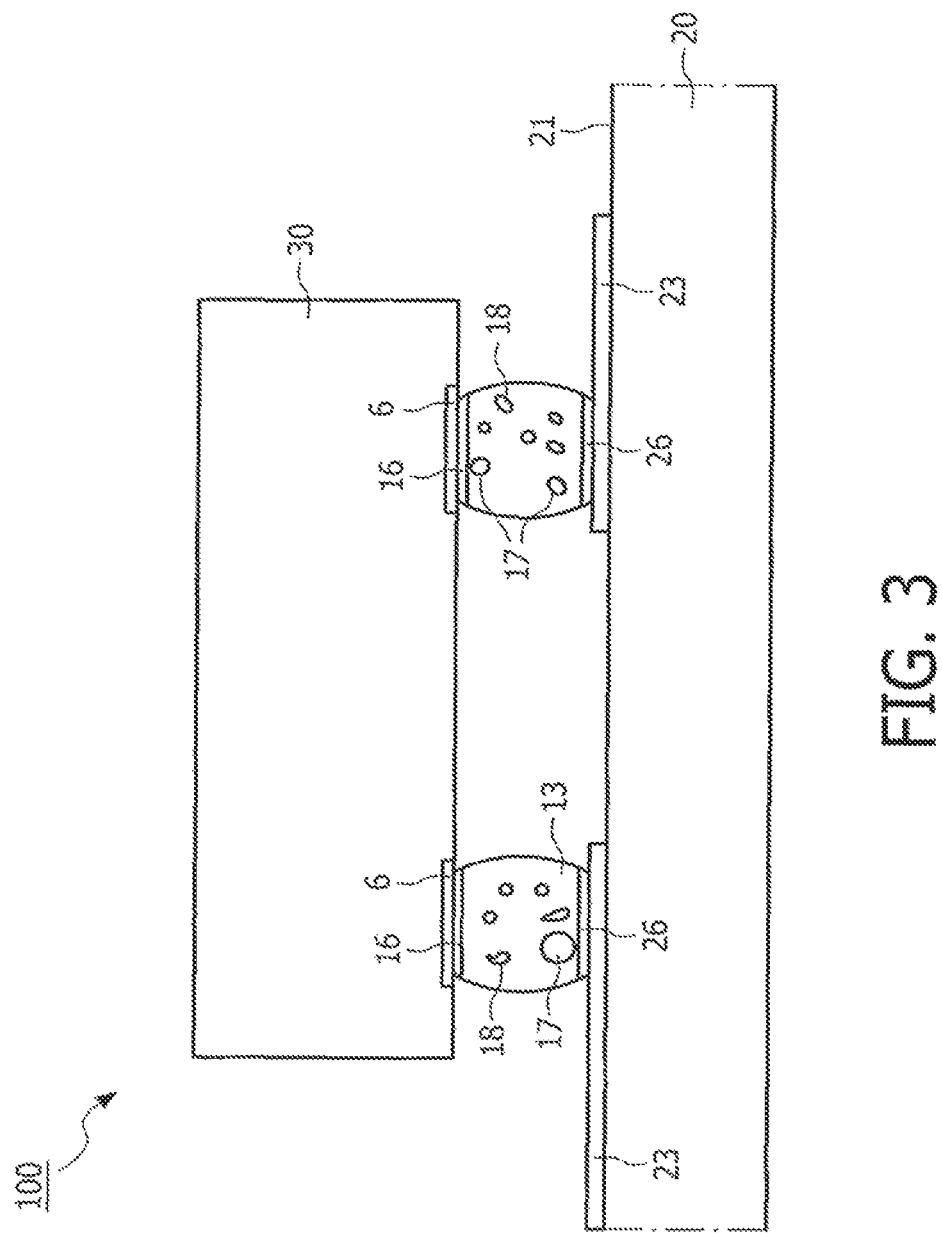
FIG. 3 shows a diagrammatic cross-sectional view of the assembly according to the invention.

FIG. 3 shows in diagrammatical cross-sectional view the assembly 100 of the invention. The integrated circuit 30 with the said solder bumps 13 is herein applied to a carrier 20 comprising aluminium tracks 23 at a first side 21 of the carrier 20. Subsequently, a bonding step is carried out with ultrasonic bonding at 35 kHz at 5 W output, at a temperature of 250° C. and during 10 seconds. The resulting connection comprises adhesion layers 16, 26 of an intermetallic compound of SnAl. Additionally, particles 17 of SnTi are formed and present within the solder bump 13 that bind the oxygen which is made free from the originally present aluminium oxide surface layer. Particles 18 of SnAgTi may be present in addition to the particles 17 of SnTi with incorporated oxygen. These are the particles that did not or only partially react during the formation of the adhesion layer 16, 26.

Figure 4:
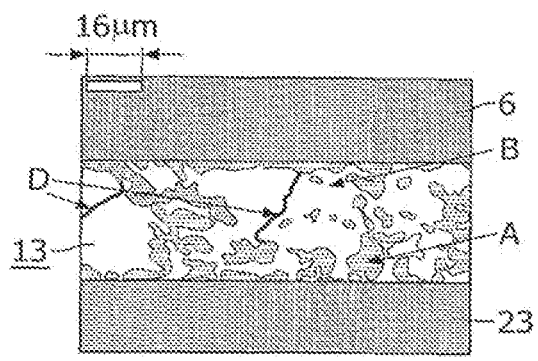
FIG. 4 shows a photograph of a first test result

FIG. 4 shows a photograph of a comparative example. In this case, use was made of a SnBi alloy without any added particles. Cracks are visible which show that the connection is not reliable. The black phase is Tin and the white phase is Bismuth.

Figure 5:
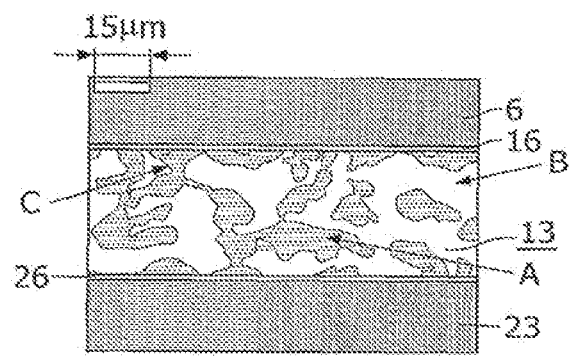
FIG. 5 shows a photograph of a second test result
Figure 6:
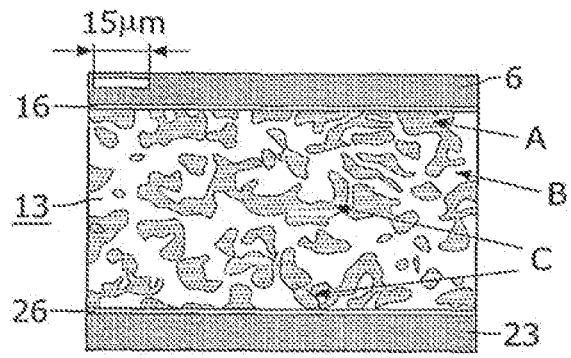
FIG. 6 shows a photograph of a test result of a comparative example

FIGS. 5 and 6 show photographs of a cross-section of connections made in first experiments. The difference between the photographs is in the morphology of the particles. FIG. 5 shows the result for needle-shaped particles and FIG. 6 shows the result for particles with an irregular shape. The surfaces contain Aluminum. Two phases can be distinguished: a phase of the matrix material of SnBi, and a phase of the SnTi particles formed, which particles incorporate the oxygen. The SnTi particles do not form an obstacle for the thermal or electrical conductivity of the connection, as they are metallic particles. The adhesion layer of the intermetallic AlSn cannot be distinguished at the photographs.

The particles in this experiment had a diameter in the order of 10-20 microns. This size will be reduced in further experiments to less than 10 microns, more preferably less than 5 microns and most preferably in the order of 1-3 microns. This reduction is done in view of the miniaturization in the IC industry. A well ohmic contact is obtained and the conductivity is good.

Figure 7:
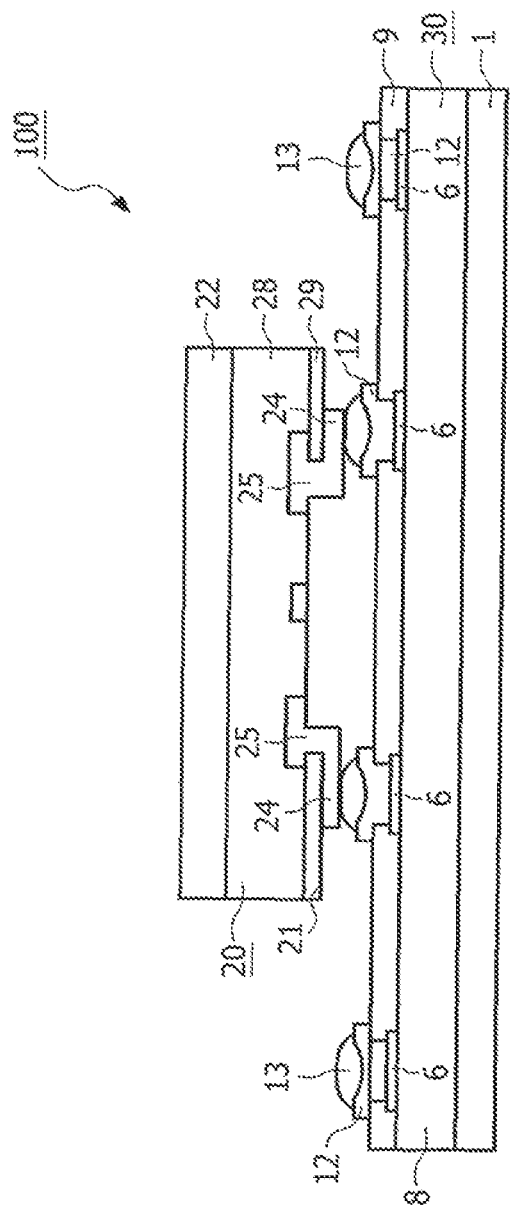
FIG. 7 shows a diagrammatic cross-sectional view of a second example of the assembly of the invention.

FIG. 7 shows in diagrammatical cross-sectional view a second embodiment of the assembly 100 according to the invention. The solder composition 13 of the invention is applied on a nickel or copper metallisation 12 in this example. In this case use is made of the technique of immersion soldering bumping as known per se. The nickel metallisation 12 is preferably applied in an electroless process. This is a maskless process, and it can be applied with a very small pitch of less than 40 microns and potentially in the order of 10 microns. The substrate 30 is then applied to a carrier 20 comprising aluminium bond pads 24. This carrier 20 is an integrated circuit in particular, having a semiconductor substrate 22, an interconnect structure 28 and a passivation layer 29. In view of the small height of the solder bump applied with immersion soldering, the bond pad 24 at the first side 21 of the carrier 20 is provided on top of the passivation layer 29 by preference, for instance in a bond pads on active process as known per se in the field. In such bond pads on active process, the bond pads 24 are rerouted to an interconnect layer 25 below the passivation layer 29 through vertical interconnects or the like. This embodiment has the advantage over conventional immersion soldering bumping, that no additional metallisation of Au need to be applied at the carrier 20. This again has the advantage that the resolution can be enhanced; contrarily to a metallisation, an aluminium bond pads on active layer 24 can be suitable applied in a wafer fab and as part of standard processing. The immersion solder bumping technique has the advantage that the soldering can be carried out without substantial pressure. It is therefore very suitable for combination with bond pads on active, that cannot generally withstand high bonding pressures. Although not shown here, any space between the carrier 20 and the substrate 30 is suitably filled with an underfill. The bond pads 6 and solder bumps 13 that are not connected to corresponding bond pads 24 at the carrier can be used for connection to an external device or to other devices. The connection to an external device is suitably made with wirebonding or flip-chip, as known in the art. The substrate 30 may contain an integrated circuit comprising active components such as transistors, but could alternatively be a passive chip comprising capacitors, resistors, inductors and optionally diodes.

Figure 8:
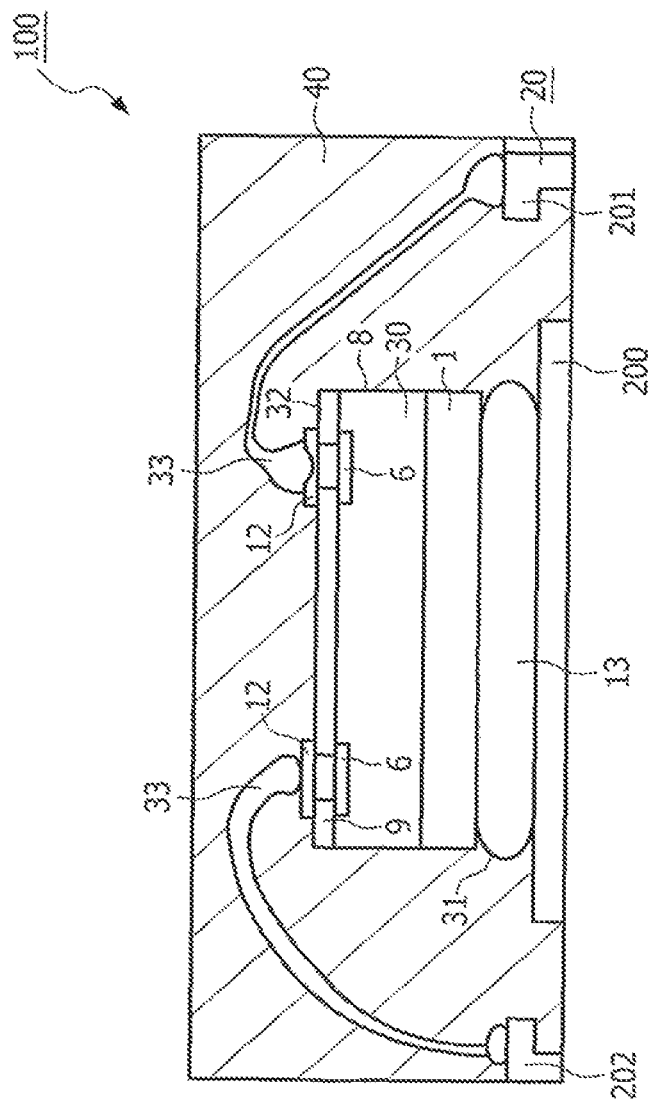
FIG. 8 shows a diagrammatic cross-sectional view of a third example of the assembly of the invention.

FIG. 8 shows in a diagrammatical cross-sectional view a further application of the solder composition of the invention. Herein, the solder composition 13 is used for soldering of a backside 31 of a semiconductor device 30 to a heat sink 200 of the carrier 20. Particularly, the semiconductor device 30 comprises a silicon substrate 1 as a support wafer. Additionally, it may contain buried layer of another material, such as an oxide, a nitride or even a silicide and/or layers of another material, including SiGe, SiC and III-V materials. The latter materials may be grown epitaxially. Surprisingly, it was found that the solder composition 13 of the invention has a good adhesion to silicon. In a first experiment, use was made of a solder composition 13 on the basis of eutectic tin-bismuth solder. Similar results may be achieved with solders with a higher melting point, such as tin-silver-copper, tin-silver and tin-copper alloys. As shown in the drawing, the device 30 is provided with an interconnect structure 8 in a top layer of which bond pads 6 are defined. Exposed through apertures in the passivation layer 9, that is present at a top side 32 of the device 30, these bond pads 6 are provided with a metallisation 12, generally referred to as underbump metallisation (UBM) and with an electrically conducting connection, in this case wirebonds 33. The wirebonds 33 are connected to contact pads 201, 202 that are part of the carrier 20. In this case, the carrier 20 is a leadframe of the HVQFN-type. The assembly is protected by an encapsulation 40 of any conventional material, such as epoxy.

The invention claimed is:
1. A structure comprising:
   a substrate with a bonding area comprising a metal that oxidizes on contact with air;
   a layer of a solder composition disposed over the bonding area, wherein particles of a thermodynamically metastable alloy are dispersed in the solder composition; and
   an adhesion layer comprising an intermetallic compound, the intermetallic compound comprising the metal that oxidizes on contact with air and an element of the thermodynamically metastable alloy, wherein the adhesion layer is disposed between the metal that oxidizes on contact with air and the layer of solder composition.

2. The structure as claimed in claim 1, wherein the element is Sn and the solder composition comprises Sn.

3. The structure as claimed in claim 1, wherein the dispersed particles are present in a weight concentration of 50% to 60%.

4. The structure as claimed in claim 1, wherein the dispersed particles are present in a weight concentration of 10% to 90%.

5. The structure as claimed in claim 1, wherein the dispersed particles have an average diameter between 0.5 and 80 mm.

6. The structure as claimed in claim 1, wherein the dispersed particles have an average diameter between 1 and 20 mm.

7. The structure as claimed in claim 1, wherein the element is chosen from the group consisting of Sn, Zn, In, Al and Bi.

* * * * *